United States Patent [19]
O'Connor

[11] Patent Number: 5,793,254
[45] Date of Patent: Aug. 11, 1998

[54] MONOLITHIC AMPLIFIER WITH STABLE, HIGH RESISTANCE FEEDBACK ELEMENT AND METHOD FOR FABRICATING THE SAME

[75] Inventor: Paul O'Connor, Bellport, N.Y.

[73] Assignee: Brookhaven Science Associates LLC, Upton, N.Y.

[21] Appl. No.: 719,092

[22] Filed: Sep. 24, 1996

[51] Int. Cl.$^6$ .................................................. H03G 3/30
[52] U.S. Cl. ........................................ 330/282; 330/86
[58] Field of Search ............................ 330/86, 277, 282, 330/296

[56] References Cited

U.S. PATENT DOCUMENTS

| | | | |
|---|---|---|---|
| 5,180,988 | 1/1993 | McDaniel | 330/282 |
| 5,327,098 | 7/1994 | Molina et al. | 330/282 X |
| 5,412,346 | 5/1995 | Burger et al. | 330/282 |

OTHER PUBLICATIONS

Sansen, W.M.C., "Limits of Low Noise Performance of Detector Readout Front Ends in CMOS Technology", IEEE Transactions on Circuits and Systems, vol. 37, No. 11, Nov. 1990.

BNL 62380, "Front–End Electronics Development at BNL", Pres. Intl Workshop on Analog Front–End VLSI Electronics for Radiation Imaging Detectors, Marathon, Greece, Sep. 28–30, 1995.

*Primary Examiner*—Steven Mottola
*Attorney, Agent, or Firm*—Margaret C. Bogosian

[57] ABSTRACT

A monolithic amplifier includes a stable, high resistance feedback circuit and a dynamic bias circuit. The dynamic bias circuit is formed with active elements matched to those in the amplifier and feedback circuit to compensate for variations in the operating and threshold voltages thereby maintaining a stable resistance in the feedback circuit.

14 Claims, 5 Drawing Sheets

MONOLITHIC AMPLIFIER WITH STABLE, HIGH RESISTANCE FEEDBACK ELEMENT AND METHOD FOR FABRICATING THE SAME

This invention was made with Government support under contract number DEAC02-76CH00016, between the U.S. Department of Energy and Associated Universities, Inc. The Government has certain rights in the invention.

BACKGROUND OF THE INVENTION

1. Field of the Invention

The present invention relates to charge sensitive amplifiers, and more particularly relates to a charge sensitive amplifier on a monolithic substrate which includes a stable, high resistance, active feedback element.

2. Description of the Prior Art

Charge sensitive amplifiers are used in a variety of commercial, industrial, medical, and scientific instrumentation applications where a signal from a sensor takes the form of a small current charge which needs amplification prior to further signal processing or conditioning. These sensors may include low-capacitance silicon detectors such as those used in particle position sensing, X-ray spectroscopy, and X-ray imaging, as well as those sensors used to detect gamma rays emitted in mammography systems, and other such low charge output sensing devices.

Charge sensitive amplifiers usually require a high value feedback resistor to achieve low noise performance. However, high value resistors are difficult to implement using conventional CMOS fabrication methods. Several circuit configurations have been used in the prior art to use an active element to achieve the desired high resistance in a monolithically formed charge sensitive amplifier. These circuit configurations suffer from several disadvantages such as periods of inoperability, feedback instability, and/or very large variations in the resistance of the feedback element due to variations in process, temperature, and power supply voltage.

FIG. 1A illustrates a first known configuration of a monolithic charge sensitive amplifier. This circuit utilizes a reset circuit to simulate the desired high resistance feedback. In this topology an amplifier 2 having an input 2A and an output 2B, has a feedback circuit that includes an integrating capacitor 4, the capacitor 4 having first and second terminals, and a field effect transistor (FET) 6 having a gate, a source and a drain. The source of the FET 6 is connected to the first terminal of capacitor 4 and to the amplifier input 2A. The drain of the FET 6 is connected to the second terminal of the capacitor 4 and to the amplifier output 2B. This circuit also includes a step voltage generator 8 having an output terminal. The gate of the FET 6 is connected to the step generator 8 output terminal and receives a periodic step voltage from the generator 8. In this configuration, the feedback capacitor 4 charges as it integrates the output of amplifier 2. The capacitor 4 will be periodically discharged by a step voltage applied to the gate of feedback FET 6 which abruptly discharges or resets the capacitor 4. The periodic charging and discharging of capacitor 4 simulates the desired high resistance feedback. However, this topology has the disadvantage of generating an undesired pulse on the amplifier output 2B during the reset period which results in the amplifier 2 being briefly inoperable.

FIG. 1B illustrates a monolithic amplifier circuit from the prior art which uses a transconductance amplifier as a blocking circuit to achieve the desired high resistance feedback. This amplifier circuit includes a signal amplifier 10, the signal amplifier 10 having a signal input 10A, a feedback input 10B and an output 10C. In certain configurations of the signal amplifier 10, the feedback input 10B may be the same electrical connection as signal input 10A. The amplifier circuit also includes a feedback capacitor 12, the capacitor 12 having first and second terminals. The first terminal of capacitor 12 is connected to the signal input 10A and the second terminal of capacitor 12 is connected to the output 10C. The amplifier circuit further includes a feedback amplifier 14, the feedback amplifier 14 having a feedback amplifier input 14A, a 10 reference input 14B and an output 14C. The feedback amplifier input 14A is connected to the signal amplifier output 10C, and the output 14C is connected to feedback input 10B. The amplifier circuit also includes a reference voltage generator 16 having an output terminal. This output terminal is connected to the reference input 14B. In this configuration, the feedback amplifier 14 is controlled by a reference signal generated by the reference generator 16. The feedback amplifier 14 is a transconductance amplifier with a narrow bandwidth which responds only to the leakage current and the DC components from the amplifier, not to high frequency signals applied to the signal input 10A. While this results in the desired high resistance feedback, this topology has the disadvantage of a limited operating range which requires manual adjustment of a reference voltage generated by reference voltage generator 16 to achieve reasonable dynamic range. Another disadvantage of this configuration is that the low bandwidth required in the feedback amplifier 14 often presents stability problems. A further disadvantage of this topology is that the low bandwidth required for the transconductance amplifier requires a long time constant and therefore requires large resistors and/or capacitors which are difficult to achieve on a monolithic substrate using a standard CMOS process.

A third example of a monolithic amplifier with active feedback known in the prior art uses a single FET device as a blocking circuit to achieve the desired high resistance, as illustrated in FIG. 1C. This circuit configuration requires four elements: an amplifier 18 having an input 18A and an output 18B; a FET 20 acting as a feedback resistor, the FET 20 including a gate, a source and a drain; a capacitor 24 having first and second terminals; and a fixed reference voltage generator 22, the generator 22 having a fixed reference voltage output terminal. The amplifier input 18A is connected to the source of the FET 20, and the amplifier output 18B is connected to the drain of FET 20 such that a feedback path from the amplifier output 18B to the amplifier input 18A is created through FET 20. The first and second terminals of the capacitor 24 are connected to the source and drain of FET 20 respectively. The gate of FET 20 is connected to the output terminal of the fixed reference voltage generator 22. The resistance of FET 20 is controlled by a voltage generated by the fixed reference generator voltage 22. In the absence of leakage current this resistance is given by Equation 1:

$$R = \frac{1}{\mu C_{ox}(W/L)(V_{gs} - V_T)} \quad \text{(Eq. 1)}$$

where $\mu$ is the inversion layer mobility, Cox is the gate capacitance per unit area, W/L is the width to length ratio of feedback FET 20, Vgs is the gate to source voltage of feedback FET 20, and $V_T$ is the threshold voltage of feedback FET 20.

As Equation 1 clearly shows, this configuration has the disadvantage that the resistance of feedback FET 20 is directly affected by both Vgs, which is derived from the fixed reference voltage generator 22 and is subject to system level tolerances, and $V_T$, which is subject to significant tolerance variation between manufacturing runs. One way to minimize the sensitivity to these variations is by making W/L very small. However, a small W/L is undesirable as it results in a high device capacitance of feedback FET 20 which degrades both the frequency response and noise characteristics of amplifier 18.

OBJECTS AND SUMMARY OF THE INVENTION

It is an object of the present invention to provide a monolithic charge sensitive amplifier with a stable, high resistance feedback circuit which has a low sensitivity to variations in both manufacturing process parameters such as threshold voltage and operating parameters such as supply voltage and temperature.

It is another object of the present invention to provide a monolithic charge sensitive amplifier with a stable, high resistance feedback circuit coupled to a bias circuit which dynamically controls the amplifier and feedback to minimize the resistance sensitivity to process and operating parameters.

It is yet a further object of the present invention to provide a monolithic charge sensitive amplifier which has a stable, high resistance feedback circuit while maintaining low feedback capacitance.

It is still a further object of the present invention to provide a monolithic charge sensitive amplifier which has a stable, high resistance feedback circuit which requires no adjustments after the amplifier is fabricated.

It is yet a further object of the present invention to provide a monolithic charge sensitive amplifier which has a stable, high resistance feedback circuit which remains continuously sensitive to input signals even in the presence of leakage current.

It is still a further object of the present invention to provide a monolithic charge sensitive amplifier which has a stable, high resistance feedback circuit which provides a compensating reduction in the feedback resistance in the presence of leakage current, thereby preventing the amplifier from saturating.

It is still a further object of the present invention to provide a monolithic charge sensitive amplifier with a stable, high resistance feedback circuit which is manufacturable using standard, commercially available, CMOS fabrication methods.

It is yet a further object of the present invention to provide a monolithic charge sensitive amplifier with a stable, high resistance feedback circuit coupled to a pole-zero circuit which compensates for the frequency response of the feedback circuit.

It is still a further object of the present invention to provide a pole-zero circuit for a monolithic charge sensitive amplifier having a stable, high resistance feedback circuit which compensates both the linear and non-linear characteristics of the feedback circuit.

It is yet a further object of the present invention to provide a method of fabricating a monolithic charge sensitive amplifier which has a stable, high resistance feedback circuit using a standard CMOS fabrication process.

It is still a further object of the present invention to provide a method of stabilizing the feedback resistance in a monolithic charge sensitive amplifier which has a stable, high resistance feedback circuit using a bias circuit that tracks variations in the feedback circuit.

It is yet a further object of the present invention to provide a method of fabricating parametrically matched FET devices where one FET device is fabricated using multiple copies of a second FET device whose parameters are to be matched.

It is still a further object of the present invention to provide a monolithic charge sensitive amplifier which overcomes the disadvantages of known monolithic charge sensitive amplifiers.

In accordance with one form of the present invention, a monolithic charge sensitive amplifier includes a FET input amplifier, a FET feedback element, and a bias circuit. The feedback element is controlled by the bias circuit which includes FET devices which are fabricated to be proportional replicas of both the input amplifier and feedback device. The input amplifier, feedback element, and bias circuit are fabricated on a monolithic substrate using a standard CMOS process such that variations in operating and fabrication parameters affecting the amplifier and feedback element are tracked and minimized by the bias circuit.

The topology of the FET amplifier is not critical and can assume any topology known in the prior art which includes at least one FET input device. In a preferred embodiment, a two FET folded cascode amplifier is used. This topology includes an input FET and a cascode FET coupled together to produce the desired system gain. The bias circuit has a first bias FET which is a geometrically scaled replica of the input FET of the cascode amplifier. This first bias FET is biased to achieve a current density which is equal to that of the input FET such that the first bias FET has a gate to source potential which is equal to, and dynamically tracks and controls, the gate to source potential of the input FET even with variations in threshold voltage.

The feedback element comprises an FET with a drain and source being coupled across the input amplifier to form a feedback path from the output of the input amplifier to the input of the input amplifier. Preferably, the size of the feedback FET can be minimized and the width to length ratio (W/L), which at least partially defines the geometry of the FET, can be optimized by approaching a value of 1. This allows the feedback FET to exhibit minimum parasitic capacitance. The bias circuit preferably further includes a second bias FET which is a scaled replica of the feedback FET and is coupled to the gate of the feedback FET. The second bias FET is fabricated as a larger replica of the feedback FET so that a higher current can be passed through it while maintaining a low current density. This higher current makes the bias FET less susceptible to influences from leakage current and noise. A bias current is passed through the second bias FET to set the desired gate to source potential of the feedback FET. By fabricating the second bias FET as a scaled replica of the geometry of the feedback FET, variations in the threshold voltage ($V_T$) experienced by the feedback FET will be mirrored by the second bias FET. The bias circuit is thus configured such that the gate to source voltage (Vgs) of the second bias FET is always substantially equal to the gate to source voltage (Vgs) of the feedback FET. This establishes the condition that Vgs–$V_T \approx K$, where K is substantially constant over variations in bias voltage, threshold voltage and temperature. This is true even when the feedback FET is operating in the moderate inversion region where K is very small, as is required to achieve a high feedback resistance. As in the prior art, the resistance of the feedback FET is given by the equation:

$$R = \frac{1}{\mu C_{ox}\left(\frac{W}{L}\right)(V_{gs} - V_T)}$$

However, with the bias circuit maintaining the condition $V_{gs}-V_T \approx K$, the resistance of the feedback FET remains substantially constant and is determined by the length to width ratio (W/L) of the feedback FET, the inversion layer mobility ($\mu$), and the gate capacitance per unit area (Cox). In this configuration the resistance is not directly affected by fluctuations in external voltages, such as the fixed reference voltage generator 22 in the prior art illustrated in FIG. 1C.

In another embodiment of the present invention, the previously described monolithic amplifier preferably includes a pole-zero cancellation circuit operatively coupled to the output of the amplifier to compensate for the frequency response of the feedback circuit. One example of such a pole-zero circuit includes a capacitor coupled across the drain and source of a pole-zero FET whose source is connected to the amplifiers output. The drain of the pole-zero FET is connected to a series resistor, the second terminal of which is the output terminal of the pole-zero circuit. The gate of the pole-zero FET is connected to the bias circuit and receives a voltage that controls the resistance between the source and drain of the pole-zero FET. In a preferred embodiment, the gate of the pole-zero FET is connected to the same point in the bias circuit as is the feedback FET so that variations in bias voltage experienced by the feedback FET are likewise experienced by, and tracked by, the pole-zero FET. The capacitor, series resistor, and the resistance of the pole-zero FET form a network that compensates for the frequency response of the feedback FET.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENTS

Figure 1A:
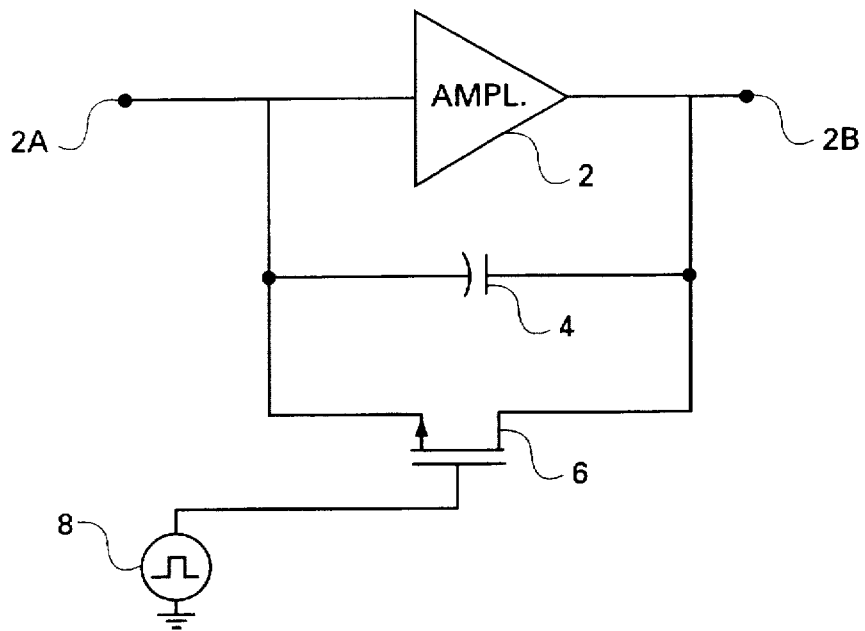
FIGS. 1A, 1B, and 1C are schematic diagrams of amplifiers with active feedback circuits known in the prior art.
Figure 1B:
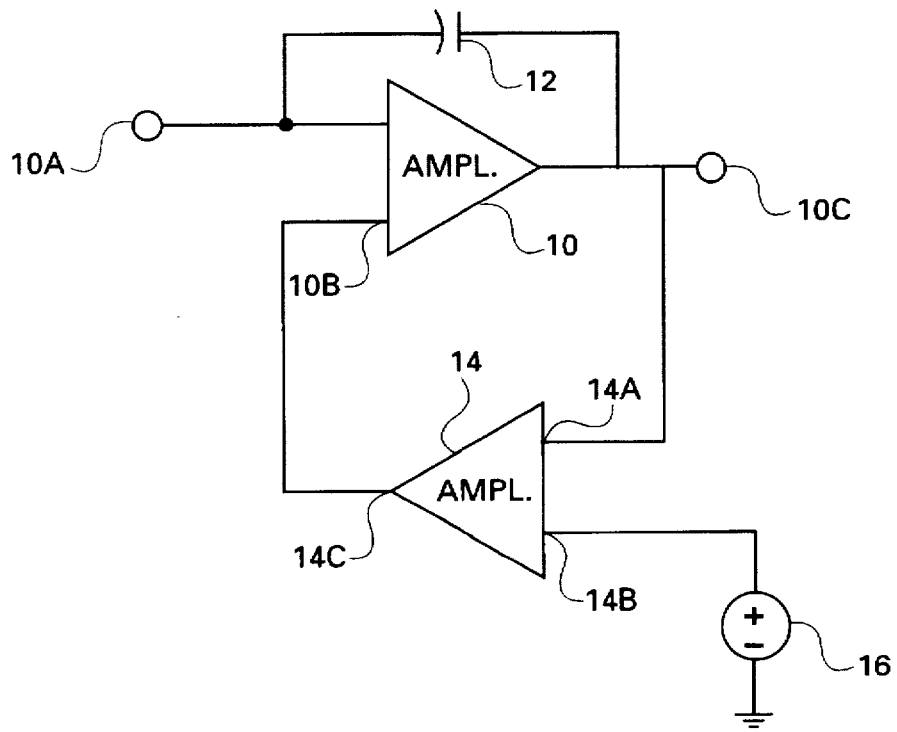
Figure 1C:
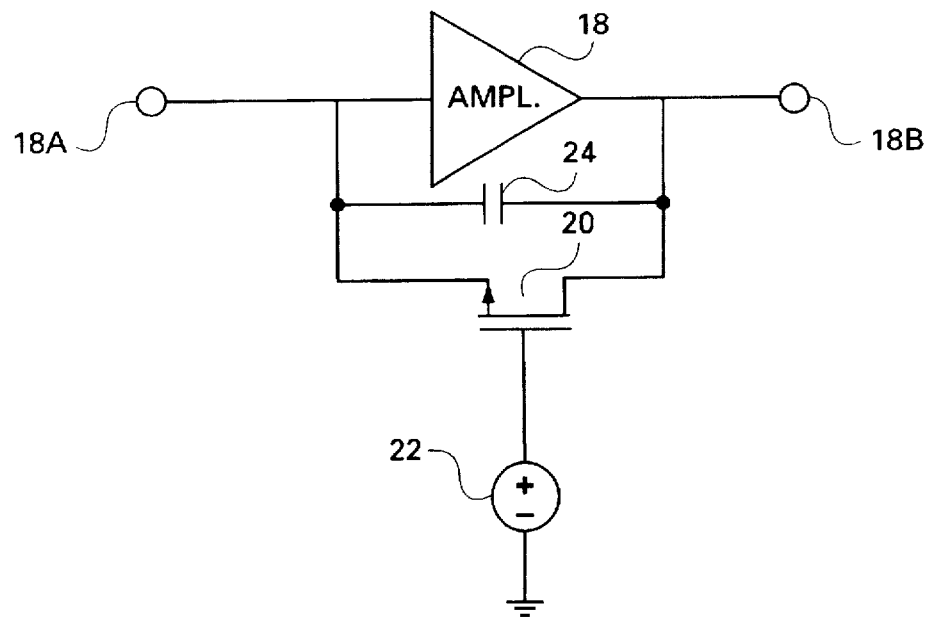
Figure 2:
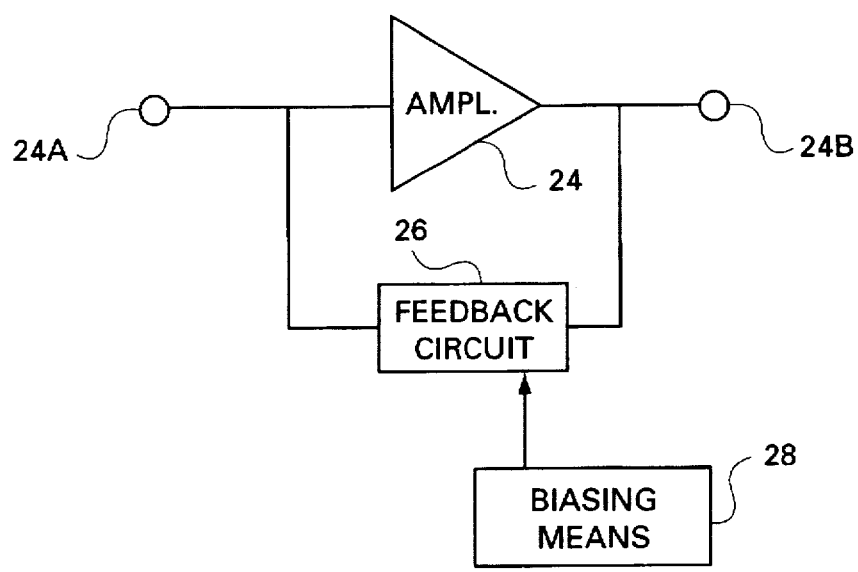
FIG. 2 is a block diagram of a charge sensitive amplifier with a stable, high resistance feedback element and biasing means formed in accordance with the present invention.

Initially referring to FIG. 2, a monolithic amplifier circuit having a stable, high resistance feedback element and formed in accordance with the present invention is illustrated in block diagram form. The amplifier circuit includes an amplifier 24, the amplifier 24 having an input 24A and an output 24B. The amplifier circuit further includes a feedback circuit 26, the feedback circuit 26 having an input, an output and a bias input, and a resistance associated therewith. The amplifier input 24A is connected to the output of feedback circuit 26, and the amplifier output 24B is connected to the input of feedback circuit 26, thus completing the feedback path across the amplifier 24. The amplifier circuit also includes a bias circuit 28, the bias circuit having a bias output. The bias input of the feedback circuit 26 is electrically connected to the bias output and receives a bias voltage which dynamically adjusts the resistance of the feedback circuit 26.

Figure 3:
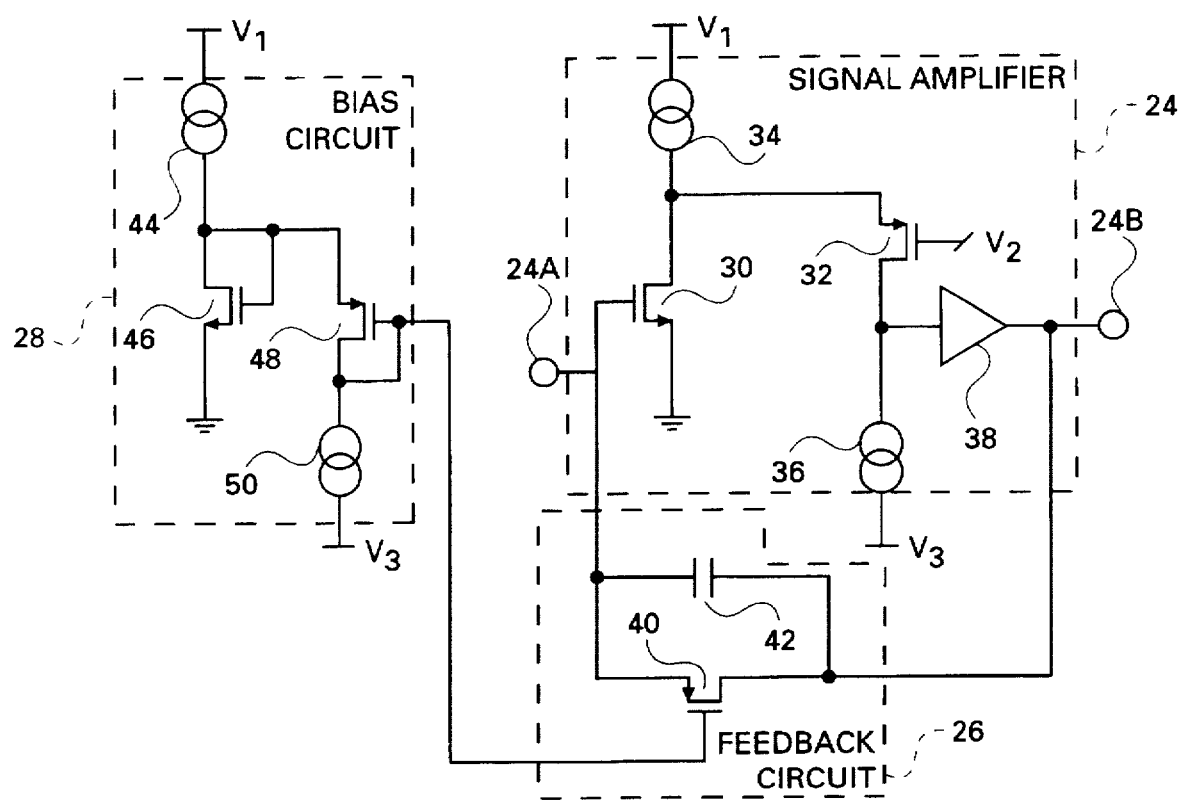
FIG. 3 is a schematic of a charge sensitive amplifier with a stable, high resistance feedback circuit and bias circuit formed in accordance with the present invention.

FIG. 3 schematically illustrates a preferred embodiment of the monolithic amplifier with stable, high resistance feedback. The amplifier 24 further includes an NMOS input FET 30 having a gate, a source and a drain; a cascode FET 32 having a gate, a source and a drain; a first current source generator 34 having first and second terminals; a second current source generator 36 having first and second terminals; and a buffer amplifier 38, having an input and an output terminal. These components are connected as a folded cascode amplifier where the gate of the input FET 30 is the amplifier input 24A. The first terminal of the first current source generator 34 is connected to an external positive voltage potential denoted as V1 in FIG. 3. The drain of the input FET 30 is connected to the source of the cascode FET 32 and the second terminal of the first current source generator 34. The source of the input FET 30 is connected to an external circuit ground potential. The gate of cascode FET 32 is connected to a fixed bias voltage denoted as V2 in FIG. 3. The drain of cascode FET 32 is connected to the first terminal of the second current source generator 36 and to the input of buffer amplifier 38. The second terminal of the second current source generator 36 is connected to a fixed bias voltage denoted as V3 in FIG. 3. The output terminal of buffer amplifier 38 is the amplifier output 24B.

The bias circuit 28 includes a third current source generator 44 with a first and second terminals; a first bias FET 46 having a gate, a source and a drain; a second bias FET 48 having a gate, a source and a drain, and a fourth current source generator 50 having first and second terminals.

The first terminal of the third current source generator 44 is connected to an external positive voltage potential, V1. The first bias FET 46 is connected in a diode configuration with the gate connected to the drain, and the source connected to circuit ground. The second bias FET 48 is also configured as a diode with the gate connected to the drain. The source of the second bias FET 48 is connected to the gate-drain connection of the first bias FET 46 and to the second terminal of the third current source generator 44. The first terminal of the fourth current source generator 50 is connected to the gate-drain connection of the second bias FET 48 and forms the output of the bias circuit 28. The second terminal of the fourth current source generator 50 is connected to V3.

The feedback circuit 26 further includes a feedback FET 40 having a gate, a source and a drain, and a feedback capacitor 42 having first and second terminals. The feedback capacitor 42 is operatively coupled across the source and drain of the feedback FET 40.

The gate of the feedback FET 40 is connected to the gate-drain connection of the second bias FET 48. The source and drain of the feedback FET 40 are connected to the amplifier input 24A, and to the amplifier output 24B, respectively. This provides a feedback path from the amplifier output 24B to the amplifier input 24A through feedback FET40.

The input FET 30 is an NMOS device fabricated on a semiconductor substrate with a width, W1, and a length, L1. The ratio of the width to length of the input FET 30 is W1/L1. The first bias FET 46, is also an NMOS device similarly fabricated on the semiconductor substrate with a width, W3, and a length, L3. The ratio of the width to length of the first bias FET 46 is W3/L3. The first bias FET 46 is fabricated as a proportionally scaled replica of the input FET 30 with W3/L3 being proportional to W1/L1. This establishes the condition that the threshold voltage of the first bias FET 46 is equal to the threshold voltage of the input FET 30. Further, the third current source 44 is selected such that the current density within the first bias FET 46 is equal to the current density within the input FET 30 of the amplifier 24. This establishes the condition that the voltage from the gate to source of the first bias FET 46 is substantially equal to the voltage from gate to source of the input FET 30. With both the input FET 30 and the first bias FET 46 having substantially equal gate to source voltages and threshold voltages, variations in these parameters experienced by the input FET 30 are tracked by the first bias FET 46.

Figure 6A:
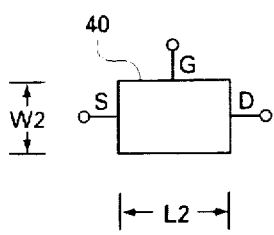
FIGS. 6A and 6B are, respectively, pictorial illustrations showing the geometry of the feedback FET, and a bias FET fabricated with multiple copies of the feedback FET, in accordance with the present invention.
Figure 6B:
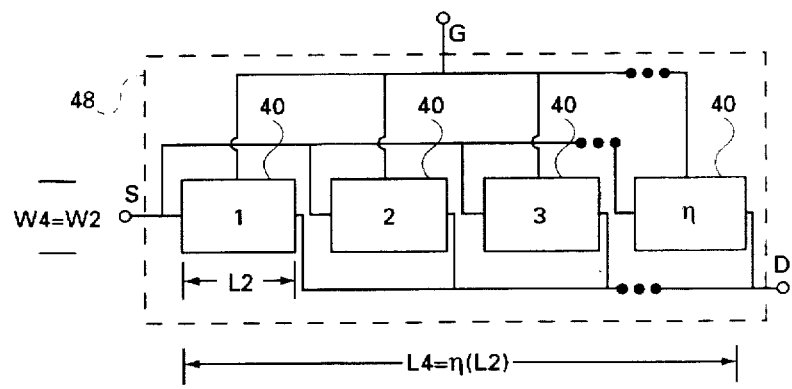
Figure 7A:
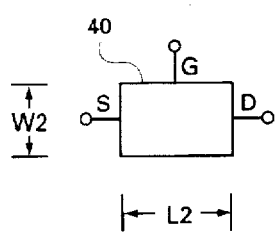
FIGS. 7A and 7B are, respectively, pictorial illustrations showing the geometry of the feedback FET, and a bias FET fabricated with multiple copies of a modified feedback FET, in accordance with the present invention.
Figure 7B:
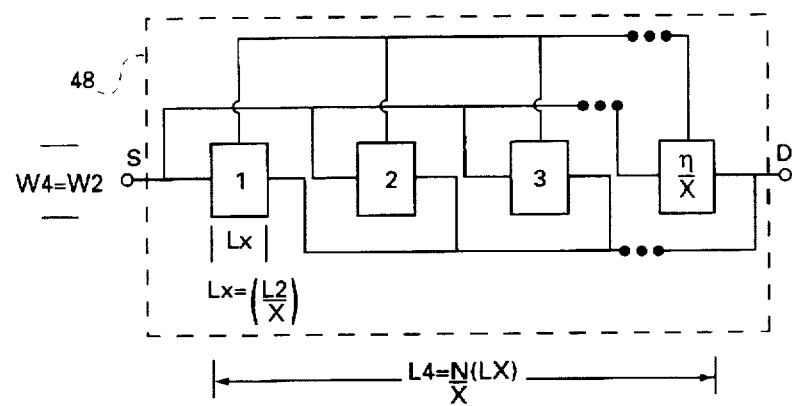

The feedback FET 40 is a PMOS device fabricated on the semiconductor substrate with a width, W2, and a length, L2. The ratio of the width to length of the feedback FET 40 is W2/L2. In order to keep the parasitic capacitance of the feedback FET 40 to a minimum, it is desirable to minimize the size of feedback FET 40. The second bias FET 48 is also a PMOS device fabricated on the semiconductor substrate with a width, W4, and a length, L4. The ratio of the width to length of the second bias FET 48 is W4/L4. The second bias FET 48 is fabricated in a manner such that W4/L4 is proportional to W2/L2 and, preferably, with the width W4 being equal to the width W2, such that both devices experience equivalent narrow channel effects. The result is that the threshold voltage in the feedback FET 40 is equal to the threshold voltage in the second bias FET 48. In a preferred embodiment of the invention, the proportionality between W2/L2 and W4/L4 is achieved by producing multiple copies of the feedback FET 40 on the substrate and interconnecting them in parallel by connecting the respective gates, sources and drains of the copies together to operate as a single device, as is illustrated in FIGS. 6A and 6B. FIG. 6A illustrates the feedback FET 40 with its dimensions W2 and L2. FIG. 6B illustrates the second bias FET 48 formed with multiple copies of feedback FET 40. In this embodiment, W4/L4 is equal to n(W2/L2), where n is the number of copies of the feedback FET 40 which comprise the second bias FET 48. It will be appreciated by those skilled in the art that this proportionality can also be achieved by various other geometries such as that illustrated in FIGS. 7A and 7B. FIG. 7A again illustrates the feedback FET 40 as in FIG. 6A. FIG. 7B illustrates an alternate fabrication of the second bias FET 48. In this embodiment, the second bias FET 48 is fabricated with a smaller number of FET elements which are each a foreshortened replica of the feedback FET 40. Specifically, the width of the elements making up the second bias FET 48 are equal to the width of the feedback FET 40. However, the length of these elements shown in FIG. 7B are shortened from those of the feedback FET 40 by a factor of X. The number of copies required to fabricate the second bias FET 48 is also reduced from n in FIG. 6B, to n/X in the topology of FIG. 7B. This yields a bias FET 48 which is significantly smaller than that of FIG. 6B. However, in the topology of FIG. 7B, the different edge effects between the feedback FET 40 and the second bias FET 48 result in a reduction in the accuracy of the resistance of feedback FET 40.

The gate voltage in both the second bias FET 48 and the feedback FET 40 is determined by the magnitude of the current generated by the fourth current source 50. The source voltage of both the second bias FET 48 and the feedback FET 40 are equal due to the previously described relationship of the first bias FET 46 and input FET 30. Therefore, the gate to source voltages of both the second bias FET 48 and the feedback FET 40 are equal. Furthermore, variations in the gate to source voltage experienced by the feedback FET 40 will be tracked and corrected by the second bias FET 48. The magnitude of the fourth current source 50 is selected to set a desired resistance from the source to drain in feedback FET 40 by Equation 2 set forth below:

$$R = \sqrt{\frac{n}{2I_4 \mu C_{ox}\left(\frac{W2}{L2}\right)}} \quad \text{(Eq. 2)}$$

where R is the resistance across the feedback FET, n is the number of copies of feedback FET 40, $I_4$ is the magnitude of the current from the fourth current source generator 50, µis the inversion layer mobility, Cox is the gate capacitance per unit area, and W2/L2 is the width to length ratio of the feedback FET 40. This equation demonstrates that the resistance across the source and drain of feedback FET 40 is independent of variations in both the threshold voltage of the feedback FET 40 and external voltages applied to the amplifier 24 or feedback FET 40.

As an illustrative example, an amplifier with a stable, high resistance feedback was implemented in a 1.2 micron CMOS process to achieve a target resistance of 1.5 MΩ. As a design target, this circuit was to use n=500, $I_4$=30 micro amperes and a W2/L2=3/20. However, in this particular application, space constraints on the substrate made this implementation impractical. To save space, the alternative embodiment shown in FIG. 7B was used with n=500 and X=10. This resulted in 50 copies of a W/L=3/2 device being used to fabricate the second bias FET 48. This modified scaling produced a narrow channel change in the threshold voltage of the second bias FET 48 which increased the resistance from 1.5MΩ, which was the target resistance, to approximately 5 MΩ. While the static resistance moved from the initial design target, the circuit did demonstrate the desired high stability, with variations in the resistance between manufacturing runs being less than twenty percent. Furthermore, in applications where a leakage current will be presented to the amplifier input 24A, the gate to source voltage of feedback FET 40 will be effectively increased, thereby reducing the resistance of the PMOS feedback FET 40. This dynamic reduction in the resistance of feedback FET 40 allows the amplifier 24 to accommodate leakage currents without going into saturation.

The maximum resistance of feedback FET 40 is dictated by the practical considerations of controlling small bias currents within the feedback FET 40 and the physical limitations within the available layout area for the second bias FET 48. With practical limitations of $I_4$>10 nanoamperes, and n<2000 copies, a feedback resistance within feedback FET 40 of about $1\times10^9 \Omega$ can be achieved, with a stability of approximately 20%.

Figure 4:
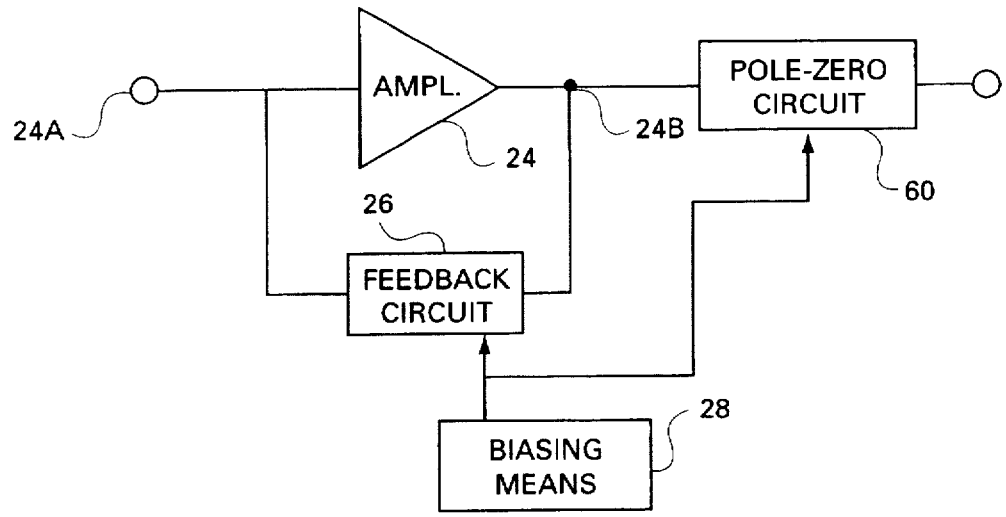
FIG. 4 is a block diagram of a monolithic charge sensitive amplifier with a stable, high resistance feedback element, biasing means and a compensating pole-zero circuit formed in accordance with the present invention.

The resistance of feedback FET 40 in parallel with feedback capacitor 42 form a low-pass response in the amplifier 24. In many applications it is desired to neutralize this frequency response. FIG. 4 shows a block diagram of the monolithic amplifier of FIG. 2 operatively coupled to a pole-zero circuit 60, in accordance with the present invention. The pole-zero circuit 60 has an input, an output terminal, and a bias input. The input of the pole-zero circuit is electrically connected to the amplifier output 24B. The bias input of the pole-zero circuit 60 is electrically connected to the output of the bias circuit 28, so that variations in bias voltage presented to the feedback circuit 26 are similarly presented to the pole-zero circuit 60. This allows the pole-zero circuit to dynamically adjust its frequency response to match that of the feedback circuit 26.

Figure 5:
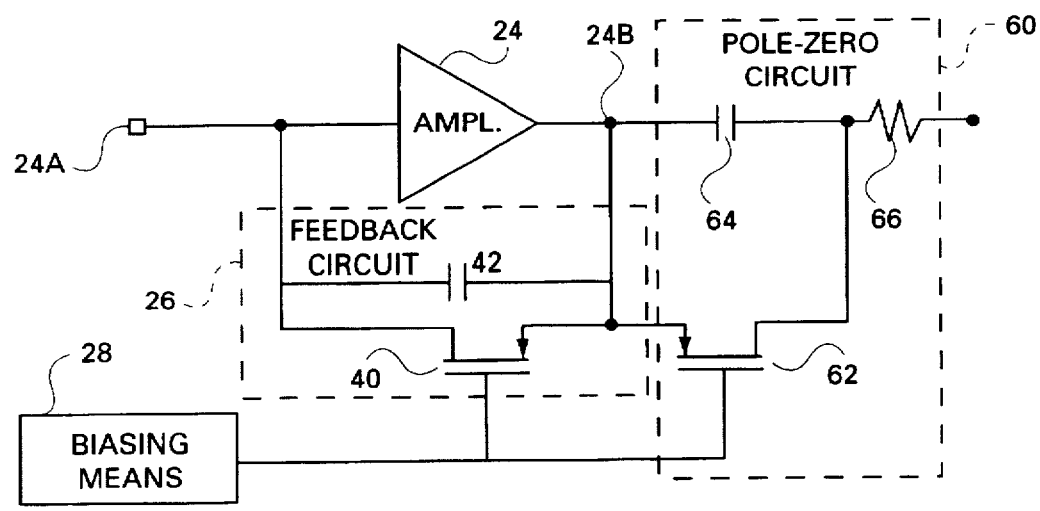
FIG. 5 is a schematic of a compensating pole-zero circuit connected to the amplifier, feedback circuit and bias circuit of FIG. 2.

FIG. 5 illustrates a preferred embodiment of the pole-zero circuit 60 operatively coupled to the amplifier 24, feedback circuit 26 and bias circuit 28. The pole-zero circuit 60 includes a pole-zero capacitor 64 having first and second terminals; a resistor 66 having first and second terminals; and a pole-zero FET 62 having a gate, a source and a drain. The amplifier output 24B is connected to the first terminal of the pole-zero capacitor 64 and the source of the pole-zero FET 62. The second terminal of the pole-zero capacitor 64 is connected to the first terminal of the resistor 66 and the drain of the pole-zero FET 62. The second terminal of the resistor 66 is the output terminal of the pole-zero circuit 60. The gate of the pole-zero FET 62 is connected to the gate of feedback FET 40 and receives the same bias voltage as feedback FET 40. The pole-zero FET 62 has a width W5, a length L5 and a width to length ratio W5/L5. W5/L5 is selected to be equal to the width to length ratio, W2/L2, of the feedback FET 40, multiplied by the ratio of the capacitance (Cpz) of the pole-zero capacitor 64, divided by the capacitance (Cf) of the feedback capacitor 42. This relationship can be stated by the equation, W5/L5=W2/L2 (Cpz/Cf).

The resistance of both the feedback FET 40 and the pole-zero FET 62 will vary in the presence of large signals due to the changing voltage potential from the gate to source on these devices. By connecting both the source of the feedback FET 40 and the source of the pole-zero FET 62 to the output of amplifier 24, as well as connecting the gate of the feedback FET 40 and the gate of pole-zero FET 62 to the bias output terminal, the voltage from gate to source for these devices remains equal even in the presence of large signal changes at the amplifier output 24B. This configuration allows any non-linear resistance variation of the feedback FET 40, which would alter the frequency response of amplifier 24, to be tracked and dynamically compensated by the pole-zero FET 62. This provides a linear frequency response over a wide dynamic range of amplifier 24 without the need for any adjustments to either the bias circuit 28 or the pole-zero circuit 60.

From the foregoing discussion, it will be appreciated by those skilled in the art that a monolithic charge sensitive amplifier formed in accordance with the present invention will achieve a stable, high resistance feedback using commercially available CMOS fabrication methods. It will be further appreciated that the feedback resistance of this amplifier exhibits a low sensitivity to variations in both manufacturing process parameters such as threshold voltage and operating parameters such as supply voltage and temperature. It will still further be appreciated that this feedback exhibits a desirably low parasitic feedback capacitance. And still further, that this feedback resistance will be maintained without the need for any adjustments.

It will be further appreciated that a monolithic charge sensitive amplifier which has a stable, high resistance feedback circuit formed in accordance with the present invention will remain continuously sensitive to input signals even in the presence of a leakage current from the input signal source. This continuous sensitivity being maintained by a compensating reduction in the feedback resistance in the presence of a leakage current from the input source which prevents the amplifier from entering saturation.

It will also be appreciated by those skilled in the art that the pole-zero circuit formed in accordance with the present invention compensates both the linear and non-linear characteristics of the feedback circuit.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A monolithic amplifier circuit with a stable, high resistance feedback comprising:

a signal amplifier, the amplifier having an input terminal and an output terminal;

feedback means, the feedback means having a bias input terminal, a first terminal, a second terminal, and a resistance associated with said first and second terminals which is responsive to a voltage applied to the bias input terminal, the first terminal being operatively coupled to the signal amplifier input terminal, the second terminal being operatively coupled to the signal amplifier output terminal such that the resistance of the feedback means is connected across the signal amplifier, said feedback means including a feedback FET, the feedback FET having a gate to source voltage Vgs and a first threshold voltage $V_T$ associated therewith; and biasing means, the biasing means having an output terminal with a voltage associated therewith, the biasing means output terminal being electrically connected to the bias input terminal of the feedback means, said biasing means being adapted to cause the voltage from the biasing means to mirror voltage variations in the feedback means such that the resistance of the feedback means is dynamically controlled and stabilized by the biasing means, said biasing means including at least one bias FET, the at least one bias FET being operatively coupled to the feedback FET and the at least one bias FET being configured as a proportional replica of the feedback FET thereby to maintain the condition Vgs−$V_T$≈constant, in both the feedback FET and the bias FET, whereby the resistance of the feedback FET is maintained substantially constant over variations of Vgs and $V_T$.

2. A monolithic amplifier circuit, as defined by claim 1, wherein:

the signal amplifier includes an input FET, the input FET having a first gate voltage and a first current density associated therewith;

wherein the biasing means includes a first bias FET and a second bias FET, the first bias FET having a second gate voltage and a second current density associated therewith, the second current density being selected to be substantially equal to the first current density whereby the first gate voltage will be substantially equal to the second gate voltage;

the feedback FET further includes a gate, and a source, and a geometric shape at least partially defined by a width to length ratio W2/L2, the source of the feedback FET being operatively coupled to the input FET to receive the first gate voltage;

the second bias FET of the biasing means includes a gate, and a source, and a geometric shape at least partially defined by a width to length ratio W4/L4, and a second threshold voltage associated therewith, the gate of the second bias FET being operatively coupled to the gate of the feedback FET, the source of the second bias FET being operatively coupled to the first bias FET to receive the second gate voltage, such that the voltage potential from the gate to source of the second bias FET is substantially equal to the voltage potential from the gate to the source of the feedback FET; and the ratio W4/L4 is proportional to the ratio W2/L2 such that the second threshold voltage is substantially equal to the first threshold voltage whereby variations in the resistance of the feedback FET due to variations in threshold voltage and gate to source voltage are minimized.

3. A monolithic amplifier, as defined by claim 2, wherein the second bias FET further includes at least two FET elements, each of the at least two FET elements having a gate, and a source, and a drain, and a geometric shape at least partially defined by a width to length ratio that is proportional to the ratio W2/L2 of the feedback FET, the respective gates, sources, and drains of the at least two FET elements being coupled together thereby forming the second feedback FET having a gate, a source, and a drain, and a geometric shape at least partially defined by a width to length ratio W4/L4.

4. The monolithic amplifier circuit, as defined by claim 3, wherein the width to length ratio of the at least two FET elements of the second bias FET are substantially equal to the width to length ratio W2/L2 of the feedback FET, and wherein the quantity of the at least two FET elements is equal to the integer quantity n elements, whereby the ratio W4/L4 is defined by the equation n(W2/L2).

5. A monolithic amplifier circuit, as defined by claim 3, wherein:

the signal amplifier includes a first current source generator having an output terminal, the input FET further includes a gate, a source and a drain, the drain being connected to the first current source generator output terminal and the input FET source being connected to a circuit ground potential, the first current source generator defining the current density of the input FET; and the biasing means includes a second current source generator, the second current source generator having an output terminal, and a third current source generator, the third current source generator having an output terminal, the first bias FET further including a gate, a source and a drain, the second bias FET further including a drain, the drain of the first bias FET being connected to the gate of the first bias FET, to the source of the second bias FET, and to the second current source generator output terminal, the first bias FET source being connected to a circuit ground potential, the second bias FET gate being connected to the second bias FET drain and to the output terminal of the third current source generator, thereby defining the biasing means output terminal; and the feedback FET further includes a drain and a parasitic feedback capacitor having first and second terminals, the feedback FET gate being connected to the biasing means output terminal, the feedback FET drain being connected to the input FET gate and the first terminal of the capacitor, the feedback FET source being connected to the second capacitor terminal and the signal amplifier output terminal, thereby forming a feedback path from the signal amplifier output terminal to the signal amplifier input terminal.

6. A monolithic amplifier circuit, as defined by claim 5, wherein:

the input FET has a geometric shape at least partially defined by a width to length ratio W1/L1, and the first bias FET has a geometric shape at least partially defined by a width to length ratio W3/L3, the ratio W1/L1 is selected to be proportional to the ratio W3/L3, and the current generated by the second current source generator is selected to be proportional to the current generated by the first current source generator in the same proportion as that of W1/L1 to W3/L3 such that the first current density is substantially equal to the second current density and the first gate voltage is substantially equal to the second gate voltage; and wherein the current generated by the third current source is selected such that a voltage potential is developed between the gate and the source of the second bias FET that is substantially equal to a voltage potential developed between the gate and the source of the feedback FET, thereby biasing the feedback FET so as to provide a stable, high resistance between the drain and source of the feedback FET.

7. A monolithic amplifier circuit, as defined by claim 6, wherein the width to length ratio of the at least two FET elements of the second bias FET are substantially equal to the width to length ratio W2/L2 of the feedback FET, and wherein the quantity of the at least two FET elements is equal to the integer quantity n elements, whereby the ratio W4/L4 is defined by the equation n(W2/L2).

8. A monolithic amplifier, as defined by claim 6, further comprising:

a pole-zero cancellation circuit, the pole-zero cancellation circuit having an input terminal, an output terminal and a bias input terminal, the input terminal being connected to the signal amplifier output terminal, and the bias input terminal being operatively coupled to the biasing means output terminal thereby receiving a voltage therefrom which adjusts the pole-zero cancellation circuit to compensate for the frequency response of the feedback circuit, the pole-zero cancellation circuit providing a frequency compensated signal at the output terminal of the pole-zero circuit.

9. A monolithic amplifier circuit, as defined by claim 8, wherein the pole-zero cancellation circuit comprises:

a pole-zero FET, the pole-zero FET having a gate, a source and a drain, a pole-zero capacitor, the capacitor having first and second terminals, and a resistor, the resistor having first and second terminals, the source of the pole-zero FET being electrically connected to the signal amplifier output terminal, the first and second terminals of the pole-zero capacitor being connected to the pole-zero FET source and drain respectively, the first terminal of the resistor being connected to the pole-zero FET drain, the second terminal of the resistor being connected to the pole-zero output terminal, and the pole-zero FET gate being connected to the biasing means output terminal.

10. A monolithic amplifier circuit, as defined by claim 9, wherein the pole-zero FET has a geometric shape at least partially defined by a width to length ratio W5/L5 which is proportional to the ratio W2/L2 of the feedback FET, the ratio W5/L5 being the product of the ratio W2/L2 and the ratio of the capacitance of the pole-zero capacitor divided by the capacitance of the feedback capacitor, whereby pole-zero cancellation is achieved at the output terminal of the pole-zero circuit.

11. A monolithic amplifier, as defined by claim 3, further comprising:

a pole-zero cancellation circuit, the pole-zero circuit having an input terminal, an output terminal and a bias input terminal, the input terminal being connected to the signal amplifier output terminal, and the bias input terminal being operatively coupled to the biasing means output terminal thereby receiving a voltage therefrom which adjusts the pole-zero cancellation circuit to compensate for the frequency response of the feedback circuit, the pole-zero cancellation circuit providing a frequency compensated signal at the output terminal of the pole-zero circuit.

12. A monolithic amplifier circuit, as defined by claim 11, wherein the pole-zero cancellation circuit comprises:

a pole-zero FET, the pole-zero FET having a gate, a source and a drain, a pole-zero capacitor, the capacitor having first and second terminals, and a resistor, the resistor having first and second terminals, the source of the pole-zero FET being electrically connected to the signal amplifier output terminal, the first and second terminals of the pole-zero capacitor being connected to the pole-zero FET source and drain respectively, the first terminal of the resistor being connected to the pole-zero FET drain, the second terminal of the resistor being connected to the pole-zero output terminal, and the pole-zero FET gate being connected to the biasing means output terminal.

13. A monolithic amplifier circuit, as defined by claim 12, wherein the pole-zero FET has a geometric shape at least partially defined by a width to length ratio W5/L5 which is proportional to the ratio W2/L2 of the feedback FET, the ratio W5/L5 being the product of the ratio W2/L2 and the ratio of the capacitance of the pole-zero capacitor divided by the capacitance of the feedback capacitor, whereby pole-zero cancellation is achieved at the output terminal of the pole-zero circuit.

14. A monolithic amplifier circuit, as defined by claim 1, further comprising:

a pole-zero cancellation circuit, the pole-zero circuit having an input terminal, an output terminal and a bias input terminal, the input terminal being connected to the signal amplifier output terminal, and the bias input terminal being operatively coupled to the biasing means output terminal thereby receiving a voltage therefrom which adjusts the pole-zero cancellation circuit to compensate for the frequency response of the feedback circuit, the pole-zero cancellation circuit providing a frequency compensated signal at the output terminal of the pole-zero circuit.

* * * * *